METHOD OF PROVIDING ELECTRICAL CONTACTS BY SPUTTERING A FILM OF GOLD ON A LAYER OF SPUTTERED MOLYBDENUM

Filed July 1, 1966

INVENTOR.
JOHN H. HALL
BY
Leo A. Plum...
ATTORNEY

United States Patent Office 3,437,888

Patented Apr. 8, 1969

3,437,888

METHOD OF PROVIDING ELECTRICAL CONTACTS BY SPUTTERING A FILM OF GOLD ON A LAYER OF SPUTTERED MOLYBDENUM

John H. Hall, Santa Clara, Calif., assignor to Union Carbide Corporation, a corporation of New York Filed July 1, 1966, Ser. No. 562,379
Int. Cl. H01l 3/12, 7/00
U.S. Cl. 317—234 7 Claims

ABSTRACT OF THE DISCLOSURE

A process for providing an electrical contact on a surface of a semiconductive body by sputtering a film of molybdenum over the surface of the body, and thereafter sputtering a film of gold over the molybdenum.

This invention relates to semiconductor devices and more particularly to the provision of electrical contacts to the semiconductor elements in such devices.

Aluminum has been known as an effective contacting metal for forming low resistance contacts to the various doped regions of silicon semiconductor devices. It has been widely used in making electrical contacts on semiconductor devices fabricated according to the planar system. In that system a layer of oxide is first formed over the surfaces of a body of semiconductive material, such as a silicon wafer. Openings are then formed in the oxide layer to expose portions of the surface of the underlying silicon body. The remaining coating of oxide acts as a mask and dopant materials can be diffused through the openings to form regions thereunder of differing conductivities, thereby defining the various transistor regions and junctions, for example, the base, emitter, and collector regions of a transistor. An oxide layer is left in place over the finished device with openings in the oxide layer over the various regions through which an electrical contact is to be made to the underlying silicon surface.

Aluminum is a desirable contact material for making contacts to such planar silicon devices because it makes substantially ohmic contacts at P-type conductivity regions of the silicon and does not generally destroy degenerate N-type conductivity regions. Aluminum is additionally easily evaporated over the surfaces of such devices.

Aluminum however is reactive with the silicon oxide layers covering such devices, particularly at higher temperatures. Additionally, aluminum is particularly soft and easily damaged during subsequent processing steps performed on the devices. This is a particular problem in regard to the use of aluminum interconnections evaporated over the silicon oxide coating on monolithic integrated circuit devices wherein several active and passive devices may be formed in one block of silicon with interconnections formed therebetween over the silicon oxide coating. A scratch in a relatively long aluminum interconnection will of course ruin the whole device.

It is apparent then that there is a need for improved means of making electrical contacts to semiconductor devices and for improved means of interconnecting such devices in integrated circuits.

It is the primary object of this invention therefore to provide an improved means for making electrical connections to semiconductor devices as well as to provide improved means for interconnecting such devices with other active and passive devices.

It is also an object of this invention to provide methods for applying such improved contacts and interconnections to semiconductor devices and circuits. Other aims and advantages of this invention will be apparent from the following description, the appended claims and the attached drawings.

In accordance with the above objects a method is provided for making an electrical contact to the surface of a semiconductive device having an oxide coating with an opening in the oxide coating exposing the surface to be contacted, comprising sputtering a contacting film of molybdenum over at least the exposed surface of the silicon beneath the opening, and sputtering a film of gold over the molybdenum.

In the usual practice of the invention aluminum is often deposited over the exposed surface of the silicon body at which the contact is to be made and then diffused into the silicon, as by heating, to provide an ohmic contact region, and then the molybdenum is sputtered thereover followed by the sputtered gold. This is particularly the case where contact is to be made to a region of lightly doped P-type silicon since molybdenum is an N-type material. However where a good ohmic contact is possible without the need for an aluminum diffused region thereunder, then the molybdenum may be directly sputtered onto the surface of the silicon, as for example when a contact is to be made to an N+ type region.

It is an important aspect of this invention that the molybdenum and gold contact materials be sputtered onto the surfaces they are to contact and cover, for reasons set forth hereinafter. Accordingly a process is provided for forming an adherent molybdenum-gold composite contact and/or interconnections over the surface of a silicon body having a coating of oxide over selected parts thereof, comprising passing a stream of inert gas through a high velocity flow of electrons between a cathode and an anode in an evacuated chamber having a pressure of about $1 \times 10^{-3}$ torrs of inert gas, maintaining a target body composed first of molybdenum and later of gold at a negative potential of about 1000 volts in said chamber whereby the ionized stream of inert gas removes molybdenum from said target body by ion sputtering, and exposing the semiconductor body to be coated to the stream of sputtered molybdenum, and thereafter exposing only the gold target body to the stream of ionized gas and exposing the molybdenum coated body to the stream of sputtered gold.

The molybdenum-gold contacts and interconnections of this invention have excellent electrical and mechanical properties. Molybdenum is hard, durable and not readily scratched. It has a low resistivity and approximately the same temperature coefficient of expansion as silicon. Molybdenum adheres well to both silicon and oxide surfaces when applied according to the process of this invention. It does not diffuse readily into silicon dioxide and does not react with silicon at ordinary temperatures.

Thte molybdenum contacts and interconnections should be sputtered however. It has been found that the evaporation of molybdenum onto the surfaces of silicon semiconductor devices having oxide coatings does not produce adherent, reliable contacts or interconnections. The presence of any residual oxide in the holes to which contact is to be made prevents the proper bonding of the molybdenum to the silicon surface. When the molybdenum is applied by sputtering however, the sputtered molybdenum penetrates such residual oxide and makes a good electrical and mechanical bond to the silicon surface thereunder.

Since molybdenum does not provide a good bond to gold wires, it is necessary to provide a layer of gold over the sputtered molybdenum contacts and interconnections of this invention. The molybdenum material deposited will form an oxide layer over its surface on exposure to air and it has been found that the needed gold layer should not be evaporated over the molybdenum, but that this gold layer should be applied by sputtering. The sputtered gold will penetrate any oxide coating on the molybdenum and make a good electrical and mechanical bond to the molybdenum. A superior contact results with the application of sputtered gold on the molybdenum even if there were no oxide coating on the molybdenum and therefore the gold overlayer should be applied by sputtering. The gold overlay is very adherent to the molybdenum and has excellent thermocompression bonding characteristics.

Figure 1:
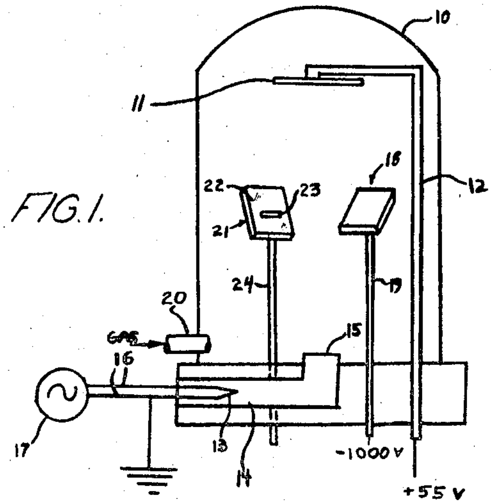
FIG. 1 is a schematic front elevational view of an apparatus for use in applying the sputtered molydenum-gold contacts and interconnections in accordance with this invention.

With reference more particularly to the drawings, FIG. 1 shows apparatus suitable for depositing the molybdenum and gold films making up the contacts of this invention by ion sputtering. Shown in FIG. 1 is a vacuum chamber or bell jar 10 in which is disposed an anode 11 on a support 12 which also provides for an electrical connection to the anode. Filament 13 located in passageway 14 generates electrons which are accelerated through the duct 15 and into the chamber towards the anode 11 by the electrical potential between the cathode filament 13 and the anode 11. The ends of the filament 13 are connected to electrical leads 16 leading to a power supply 17 with one lead grounded. Suitable operating voltages for the filament are between 6 and 100 volts AC or DC. The anode is maintained at a positive voltage between 20 and 100 volts, typically 55 volts.

A target body 18 is supported on an arm 19 connected to a source of negative potential between —50 and —5000 volts, and typically —1000 volts. A conduit 20 provided with a valve (not shown) allows for the introduction of gases, for example argon, which is ionized by collisions with the stream of electrons flowing from the filament to the anode. Argon ions from this plasma are accelerated toward the target body 18 with a velocity sufficient to cause vaporization and removal of target body material from the target. The vaporized target body material condenses on the surfaces of a substrate 21, shown having a mask 22 with an opening 23 defining the geometry of a desired contact area or interconnection. More commonly the whole surface of the semiconductor body or wafer is covered first with sputtered molybdenum and then with sputtered gold, and the gold and then the molybdenum are removed from all areas of the surface other than the contact or interconnection sites. In such a case the substrate 21 is actually an unmasked wafer of silicon or group of such wafers mounted side by side on a substrate holder.

The substrate is supported on an arm 24 and is maintained at a desired temperature, generally about 150° C., by a heater inside the substrate holder (not shown.)

The chamber is evacuated through conduits leading from the bell jar to suitable pumps (not shown.)

The target body for sputtering molybdenum can be a sheet of pure molybdenum. The target body for sputtering the gold overlay can be a sheet of pure gold. It is convenient to have both target bodies available in the bell jar so that both depositions can be performed in one pump down, thereby avoiding the problem of contaminations and oxide growth associated with separate sputtering operations, i.e., the need to break the vacuum to substitute a new target body after the first deposition. This can be accomplished by providing both the molybdenum and the gold target bodies on supports in the same bell jar, with provision for shielding of the gold target body during molybdenum sputtering and for shielding of the molybdenum target body during the later gold sputtering.

The pressure of inert gas in the chamber may be varied from about $0.5\times10^{-3}$ torrs to about $1\times10^{-2}$ torrs depending on the desired rate of material removal from the target body. Increasing the inert gas pressure and thereby reducing the vacuum within the chamber increases the rate of sputtering. The minimum pressure represents the lower range of deposition rates. The target voltage and electron current also determine the sputtering rate. These parameters can be adjusted to give a desired sputtering rate in the chamber. Thickness of the deposited material is then a function of the time of exposure to the sputtered stream.

Figure 2A:
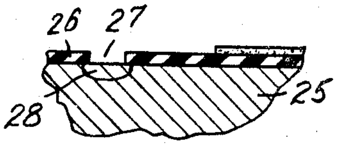
FIGS. 2A through 2H are sectional and plan views of a molybdenum-gold contact and interconnection, greatly exaggerated, in various stages of fabrication according to the principles of this invention.
Figure 2B:
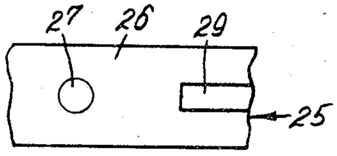

FIGS. 2A through 2H show a method of making an electrical contact to a site on a semiconductor device as well as an interconnection from said contact to another component on the same oxide-covered block of semiconductor material. FIG. 2A shows a sectional view and FIG. 2 B shows a plan view of a portion of a substrate 25 upon which an oxide layer 26 has been formed. An opening 27 in the oxide layer exposes a contacting site. It is assumed that the underlying structure provides a good ohmic region for contacting with molybdenum. If such is not the case, an aluminum doped region may be formed therein as indicated generally at 28. Another electrical component, an end portion of an elongated film resistor is shown partially at 29, to illustrate the manner of forming interconnections.

Figure 2C:
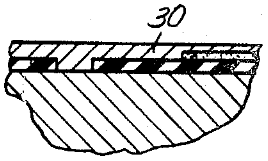
Figure 2D:
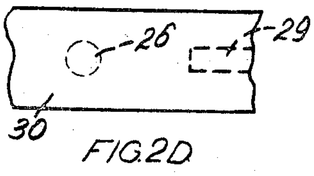
Figure 2E:
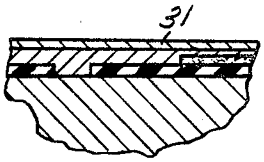
Figure 2F:
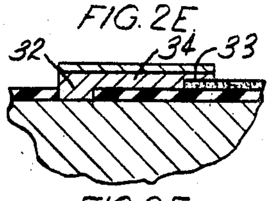
Figure 2G:
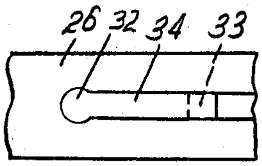

As shown in FIGS. 2C and 2D the surface of the body 25 is covered with a layer of sputtered molybdenum 30. Next a layer of sputtered gold 31 is applied over the molybdenum. The body is suitably masked and the gold and then the molybdenum are removed from all areas of the surface except where contacts or interconnections are to be maintained. As shown in FIGS. 2F and 2G, the molybdenum and gold films are removed from the oxide surface 26 of the body except for a contact to the underlying silicon at 32 and a contact to one terminal of the resistor at 33 with an interconnection 34 therebetween. It will be understood by those skilled in the art that the molybdenum-gold films can be removed in whatever pattern of contacts and interconnections is desired to electrically contact individual elements of transistors or individual terminals of any active or passive device, as well as to provide interconnections between these or any other part of semiconductor devices or their enclosing structures.

Figure 2H:
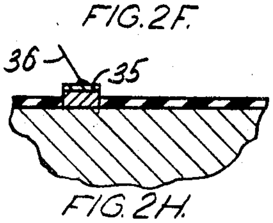

For example, as shown in FIG. 2H, only the molybdenum and gold films 35 overlying the site of contact to the semiconductive region underneath are left on the surface, all other portions of the film being etched away. A lead wire 36, of gold for example, is bonded to the gold overlying film as by thermocompression bonding.

The gold films can be removed from the oxide surface of the body using a solution of potassium cyanide. The molybdenum film can then be removed using a solution of nitric and sulfuric acids.

What is claimed is:

1. A method of forming an electrical contact on a surface of a semiconductive body comprising sputtering a film of molybdenum over the surface of the body, and thereafter sputtering a film of gold over the molybdenum.

2. A method of forming an electrical contact to the surface of a silicon semiconductor body having an oxide coating thereon with at least one opening in the oxide coating exposing the surface to be contacted, comprising sputtering a contacting film of molybdenum over at least the exposed surface of the silicon beneath the opening, and sputtering a film of gold over the molybdenum film.

3. The method as set forth in claim 2 in which the molybdenum film and then the gold film are sputtered over the whole of the surface of the body, and the gold film and then the molybdenum film are removed from all areas of the surface except in the vicinity of the surface of the silicon to be contacted under the opening.

4. A method as set forth in claim 2 in which there is at least one circuit component on the oxide coating on the semiconductor body and it is desired to interconnect at least one area of the silicon exposed at an opening in the oxide with a terminal of the component, comprising sputtering a contacting film of molybdenum over at least the exposed area of the silicon and the terminal of the component to be contacted and a desired interconnection path over the oxide coating, and sputtering a film of gold over the molybdenum film.

5. A method for forming an electrical interconnection over the oxide coating of a silicon semiconductor body between at least two terminal areas to be connected, comprising sputtering a film of molybdenum over at least the terminal areas to be connected and a desired interconnection path over the oxide coating, and sputtering a film of gold over the molybdenum.

6. A method for forming an adherent molybdenum and gold composite contact over the surfaces of a body of semiconductor material having a coating of oxide over at least selected parts thereof, comprising passing a stream of inert gas through a high velocity flow of electrons between a cathode and an anode in an evacuated chamber having a pressure of about $1 \times 10^{-3}$ torrs of inert gas, maintaining a target body composed of molybdenum at a negative potential of about 1000 volts in said chamber whereby the ionized stream of inert gas removes molybdenum from said target body by ion sputtering, exposing the semiconductor body to be coated to the stream of sputtered molybdenum to form a film thereon, and thereafter substituting a gold target body for the molybdenum target body and sputtering a film of gold over the molybdenum film on the semiconductor body.

7. An electrical device comprising a body of silicon semiconductor material having an oxide coating thereon and having molybdenum and gold contacts and interconnections formed by the process of claim 2.

References Cited

UNITED STATES PATENTS

| | | | |
|---|---|---|---|
| 3,341,753 | 9/1967 | Cunningham -------- | 317—234 |
| 3,365,628 | 1/1968 | Luxem ------------- | 317—234 |
| 3,218,194 | 11/1965 | Maissel ------------ | 117—217 |
| 3,325,702 | 6/1967 | Cunningham -------- | 317—234 |
| 3,365,626 | 1/1968 | Mohler ------------ | 317—230 |

JOHN W. HUCKERT, *Primary Examiner.*

M. EDLOW, *Assistant Examiner.*

U.S. Cl. X.R.

117—212; 204—192; 317—235